United States Patent
Ji

(10) Patent No.: US 11,853,240 B2
(45) Date of Patent: Dec. 26, 2023

(54) DATA TRANSMISSION CIRCUIT, DATA TRANSMISSION METHOD, AND MEMORY

(71) Applicant: CHANGXIN MEMORY TECHNOLOGIES, INC., Hefei (CN)

(72) Inventor: Kangling Ji, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 51 days.

(21) Appl. No.: 17/805,934

(22) Filed: Jun. 8, 2022

(65) Prior Publication Data

US 2023/0267083 A1  Aug. 24, 2023

Related U.S. Application Data

(63) Continuation of application No. PCT/CN2022/087833, filed on Apr. 20, 2022.

(30) Foreign Application Priority Data

Feb. 24, 2022  (CN) .......................... 202210174055.9

(51) Int. Cl.
*G06F 13/16* (2006.01)
*G06F 1/12* (2006.01)

(52) U.S. Cl.
CPC ............ *G06F 13/1689* (2013.01); *G06F 1/12* (2013.01)

(58) Field of Classification Search
CPC ........ G06F 13/1689; G06F 1/12; G11C 29/42
See application file for complete search history.

(56) References Cited

U.S. PATENT DOCUMENTS 6,522,581 B2   2/2003  Takata et al.
6,862,653 B1 *  3/2005  Dodd .................. G06F 13/1673
                                                   710/310

(Continued)

FOREIGN PATENT DOCUMENTS

CN   1156280 A   8/1997
CN   1804815 A   7/2006

(Continued)

OTHER PUBLICATIONS

International Search Report cited in PCT/CN2022/087961 dated Sep. 27, 2022, 10 pages.

(Continued)

*Primary Examiner* — Phong H Dang
(74) *Attorney, Agent, or Firm* — Cooper Legal Group, LLC

(57) ABSTRACT

The data transmission circuit includes: at least two data transmission structures. Each data transmission structure includes a memory transmission terminal, a bus transmission terminal, and an interactive transmission terminal. Data inputted from the memory transmission terminal is outputted through the bus transmission terminal or the interactive transmission terminal. Data inputted from the bus transmission terminal is outputted through the memory transmission terminal or the interactive transmission terminal. Data inputted from the interactive transmission terminal is outputted through the bus transmission terminal or the memory transmission terminal. A control module receives an input control signal and an adjustment control signal that are provided by the memory; the control module is configured to output the input control signal in a delayed manner based on the adjustment control signal, so as to generate an output control signal corresponding to the input control signal.

15 Claims, 3 Drawing Sheets

(56) References Cited

U.S. PATENT DOCUMENTS

| | | |
|---|---|---|
| 8,041,890 B2 | 10/2011 | Wei |
| 8,356,186 B1* | 1/2013 | Bean ................ G06F 21/72 |
| | | 713/189 |
| 10,339,050 B2 | 7/2019 | Hansson et al. |
| 10,438,650 B1 | 10/2019 | Yamashita et al. |
| 10,846,171 B2 | 11/2020 | Cho et al. |
| 11,314,592 B2 | 4/2022 | Song et al. |
| 2002/0051401 A1 | 5/2002 | Lee |
| 2006/0112239 A1 | 5/2006 | Ruckerbauer et al. |
| 2006/0200728 A1 | 9/2006 | Nagai et al. |
| 2006/0277355 A1* | 12/2006 | Ellsberry ............ G06F 12/06 |
| | | 711/154 |
| 2010/0034036 A1* | 2/2010 | Park ................ G11C 29/50012 |
| | | 365/194 |
| 2015/0229557 A1 | 8/2015 | Kim et al. |
| 2015/0378956 A1* | 12/2015 | Dearth ............. G06F 13/4234 |
| | | 710/308 |
| 2018/0089079 A1* | 3/2018 | Hansson ........... G06F 13/4234 |
| 2020/0027494 A1* | 1/2020 | Yamashita ......... G11C 11/4082 |
| 2021/0407576 A1 | 12/2021 | Shang et al. |

FOREIGN PATENT DOCUMENTS

| | | |
|---|---|---|
| CN | 1832489 A | 9/2006 |
| CN | 101281481 A | 10/2008 |
| CN | 101354666 A | 1/2009 |
| CN | 103136141 A | 6/2013 |
| CN | 108447514 A | 8/2018 |
| CN | 109716314 A | 5/2019 |
| CN | 110739014 A | 1/2020 |
| CN | 113094203 A | 7/2021 |
| CN | 113470711 A | 10/2021 |
| JP | 2019220003 A | 12/2019 |

OTHER PUBLICATIONS

International Search Report cited in PCT/CN2022/087829 dated Oct. 25, 2022, 8 pages.
International Search Report cited in PCT/CN2022/087833 dated Nov. 23, 2022, 8 pages.

* cited by examiner

US 11,853,240 B2

DATA TRANSMISSION CIRCUIT, DATA TRANSMISSION METHOD, AND MEMORY

CROSS-REFERENCE TO RELATED APPLICATIONS

This is a continuation of International Application No. PCT/CN2022/087833, filed on Apr. 20, 2022, which claims the priority to Chinese Patent Application 202210174055.9, titled "DATA TRANSMISSION CIRCUIT, DATA TRANSMISSION METHOD, AND MEMORY" and filed on Feb. 24, 2022. The entire contents of International Application No. PCT/CN2022/087833 and Chinese Patent Application 202210174055.9 are incorporated herein by reference.

TECHNICAL FIELD

The present disclosure relates to, but is not limited to, a data transmission circuit, a data transmission method, and a memory.

BACKGROUND

Dynamic random access memory (DRAM) is commonly used as a storage device for mobile devices due to the characteristics such as non-volatility, power reduction, small size, and no mechanical structure.

With the advancement of technology, consumers have increasingly high requirements for the performance of mobile devices. In this case, the transmission rate becomes a key parameter for evaluating the quality of the storage device.

SUMMARY

The present disclosure provides a data transmission circuit, a data transmission method, and a memory.

An embodiment of the present disclosure provides a data transmission circuit, applied to a memory that includes a data bus and a plurality of memory regions. The data transmission circuit includes: at least two data transmission structures, wherein each of the data transmission structures includes a memory transmission terminal, a bus transmission terminal, and an interactive transmission terminal, the memory transmission terminal is configured to connect to the memory region, the bus transmission terminal is configured to connect to the data bus, and the interactive transmission terminal is configured to connect to another data transmission structure; data inputted from the memory transmission terminal is outputted through the bus transmission terminal or the interactive transmission terminal; data inputted from the bus transmission terminal is outputted through the memory transmission terminal or the interactive transmission terminal; data inputted from the interactive transmission terminal is outputted through the bus transmission terminal or the memory transmission terminal; the data inputted from the interactive transmission terminal is data inputted through the bus transmission terminal or the memory transmission terminal of another data transmission structure; a control module is connected to the data transmission structure and receives an input control signal and an adjustment control signal that are provided by the memory; the control module is configured to output the input control signal in a delayed manner based on the adjustment control signal, so as to generate an output control signal corresponding to the input control signal, wherein the input control signal and the output control signal are used for indicating a data transmission path of the data transmission structure.

An embodiment of the present disclosure provides a data transmission method, applied to the data transmission circuit provided by the foregoing embodiment. The data transmission method includes: receiving the input control signal and the adjustment control signal; generating the output control signal corresponding to the input control signal based on the input control signal and the adjustment control signal, wherein a signal delay between the input control signal and the output control signal is controlled by the adjustment control signal; obtaining the data transmission path based on the input control signal and the output control signal; and transmitting data based on the data transmission path.

An embodiment of the present disclosure provides a memory, which adopts the data transmission circuit provided by the foregoing embodiment to transmit data.

BRIEF DESCRIPTION OF THE DRAWINGS

The accompanying drawings which constitute a part of the present disclosure provide further comprehension of the present disclosure. The schematic embodiments of the present disclosure and description thereof are intended to explain the present disclosure and do not constitute an improper limitation to the present disclosure. In the accompanying drawings.

DETAILED DESCRIPTION

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some but not all of the embodiments of the present disclosure. All other embodiments obtained by those of ordinary skill in the art based on the embodiments of the present disclosure without creative efforts should fall within the protection scope of the present disclosure. It should be noted that the embodiments in the present disclosure and features in the embodiments may be combined with each other in a non-conflicting manner.

Figure 1:
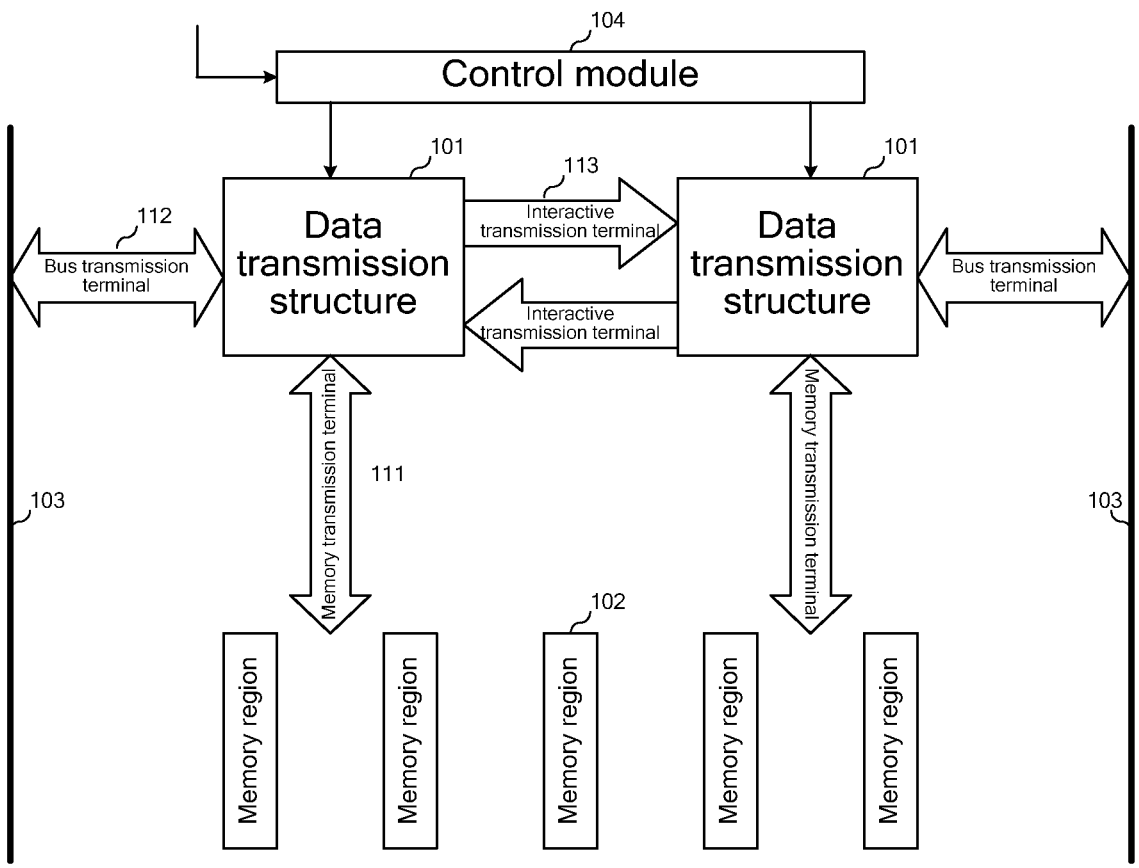
FIG. 1 is a schematic structural diagram of a data transmission circuit according to an embodiment of the present disclosure.
Figure 2:
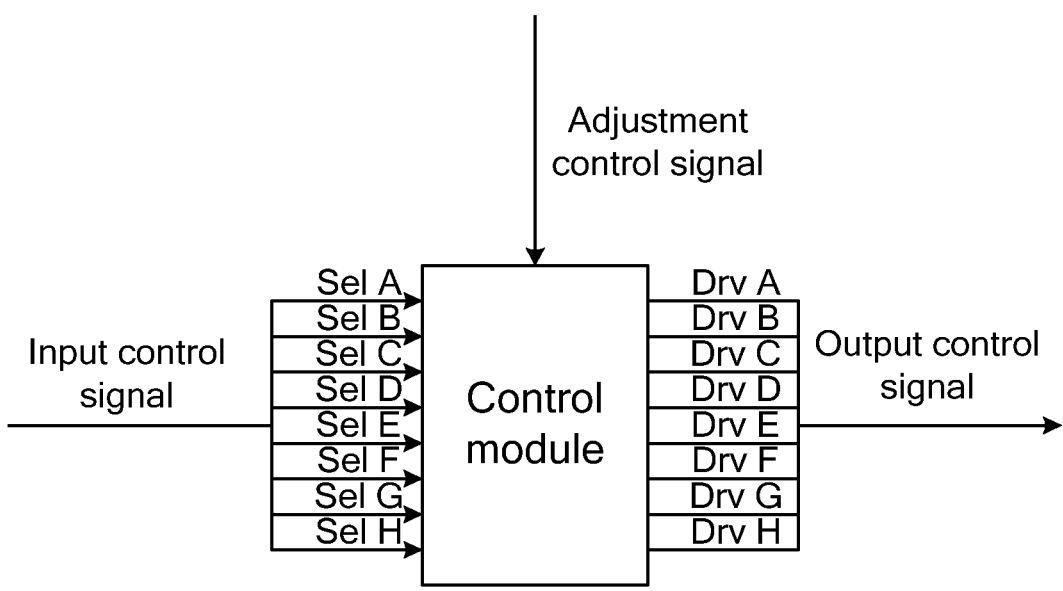
FIG. 2 is specific schematic structural diagram of a control module according to an embodiment of the present disclosure.
Figure 3:
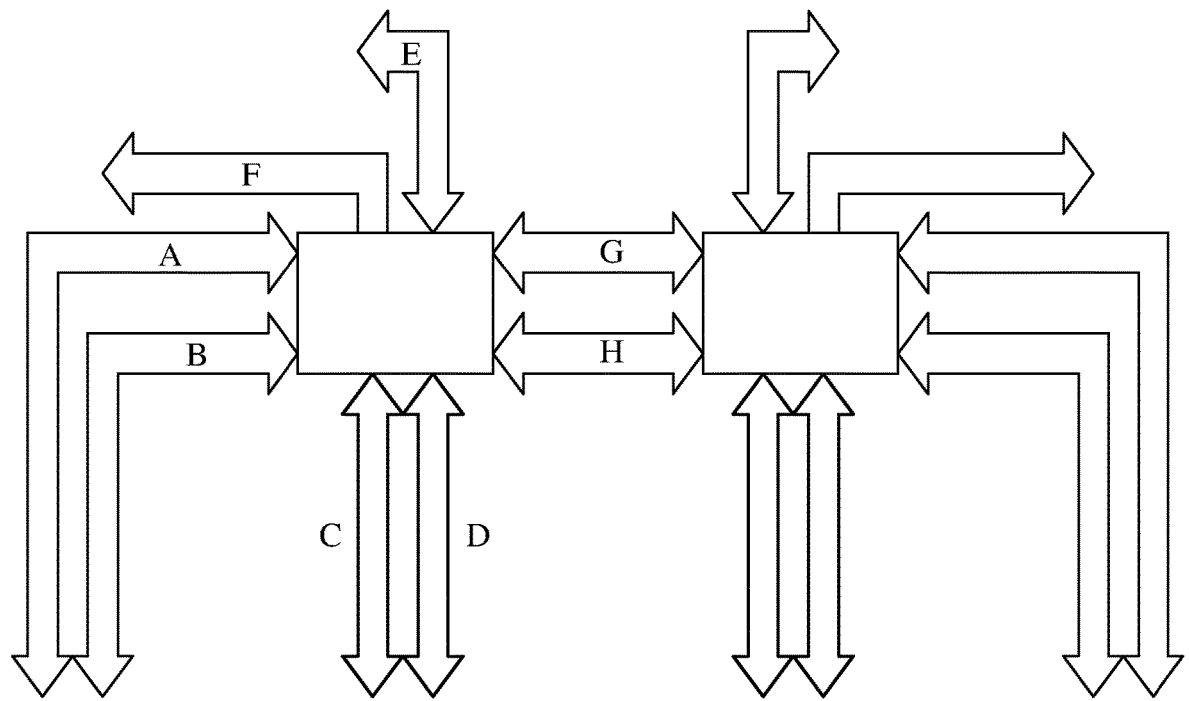
FIG. 3 is schematic diagram of a specific connection manner of a data transmission structure according to an embodiment of the present disclosure.
Figure 4:
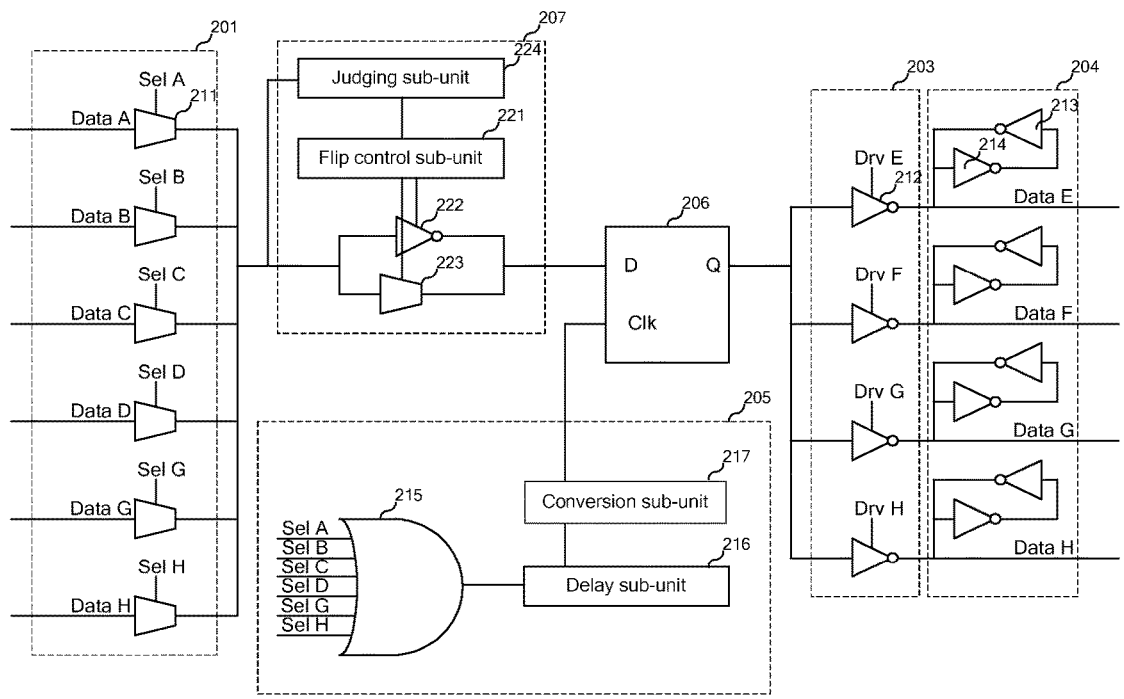
FIG. 4 is a specific schematic structural diagram of a data transmission structure during data reading according to an embodiment of the present disclosure.
Figure 5:
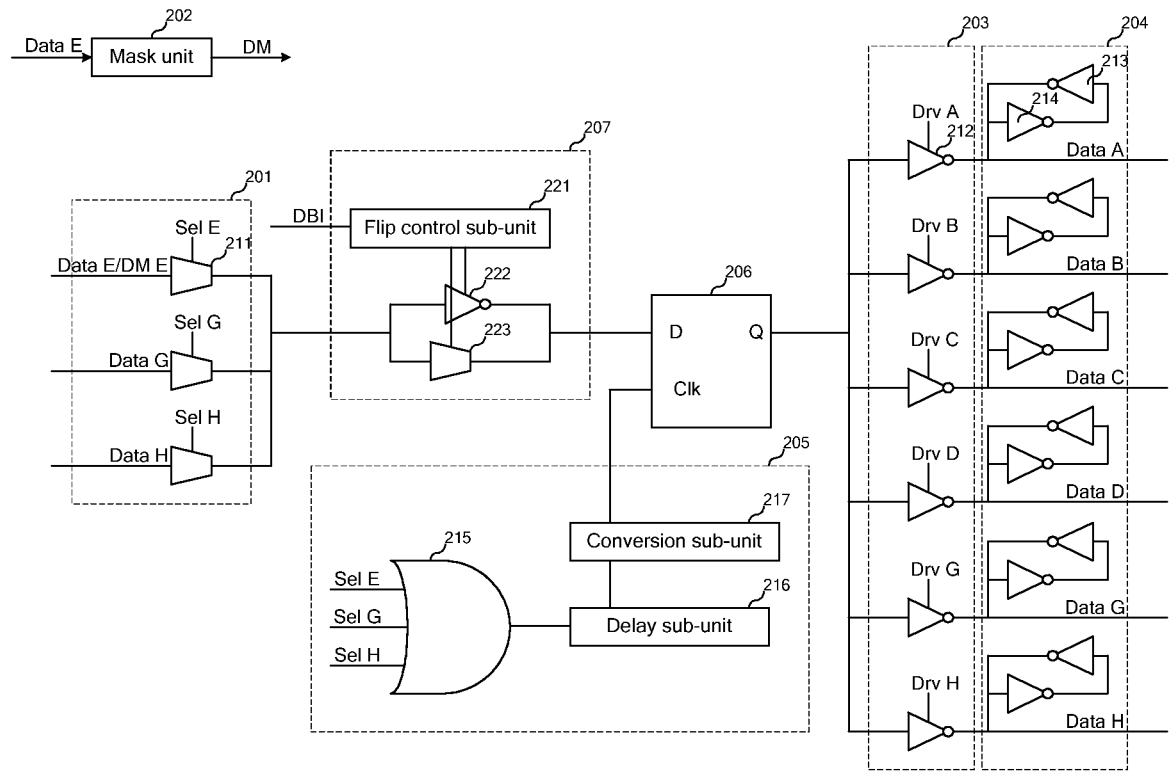
FIG. 5 is a specific schematic structural diagram of a data transmission structure during data writing according to an embodiment of the present disclosure.

FIG. 1 is a schematic structural diagram of a data transmission circuit according to this embodiment; FIG. 2 is specific schematic structural diagram of a control module according to this embodiment; FIG. 3 is schematic diagram of a specific connection manner of a data transmission structure according to this embodiment; FIG. 4 is a specific schematic structural diagram of a data transmission structure during data reading according to this embodiment; FIG. 5 is a specific schematic structural diagram of a data transmission structure during data writing according to this embodiment. The following describes the data transmission circuit provided by this embodiment in further detail with reference to the accompanying drawings.

Referring to FIG. 1, the data transmission circuit is applied to a memory. The memory includes a data bus 103 and a plurality of memory regions 102. The data transmission circuit includes at least two data transmission structures 101.

Each data transmission structure includes a memory transmission terminal 111, a bus transmission terminal 112, and an interactive transmission terminal 113. The memory transmission terminal 111 is connected to the memory region 102; the bus transmission terminal 112 is connected to the data bus 103; the interactive transmission terminal 113 is connected to the interactive transmission terminal 113 of another data transmission structure.

Data inputted from the memory transmission terminal 111 is outputted through the bus transmission terminal 112 or the interactive transmission terminal 113. Data inputted from the bus transmission terminal 112 is outputted through the memory transmission terminal 111 or the interactive transmission terminal 113. Data inputted from the interactive transmission terminal 113 is outputted through the bus transmission terminal 112 or the memory transmission terminal 111. Data inputted from the interactive transmission terminal 113 is data inputted through the bus transmission terminal 112 or the memory transmission terminal 111 of another data transmission structure 101.

The control module 104 is connected to the data transmission structure 101 and receives an input control signal and an adjustment control signal provided by the memory to which the control module 104 belongs.

Referring to FIG. 1 in combination with FIG. 2, the control module 104 is configured to output the input control signal in a delayed manner based on the adjustment control signal, to generate an output control signal corresponding to the input control signal. The input control signal and the output control signal are used for indicating a data transmission path of the data transmission structure 101.

The adjustment control signal is generated based on the memory to which the data transmission circuit belongs, and is used for controlling a delay between the corresponding input control signal and output control signal.

The control module 104 controls data transmission paths of two data transmission structures 101, so that different data transmission structures transmit data alternately. Data transmission of different memory regions 102 can be implemented corresponding to the same data transmission structure 101. Through alternate transmission of multiple paths of data, data transmission is more compact, thereby improving the data transmission efficiency of the memory.

It should be noted that, in other embodiments, the quantity of data transmission structures may be any even number greater than 2. Every two data transmission structures form the foregoing data transmission circuit, thereby further improving the data transmission efficiency of the memory.

Specifically, a signal delay between the input control signal and the output control signal is controlled by the adjustment control signal, which avoids an output terminal from turning on earlier than or later than preset timing, ensuring that the data transmission structure outputs the corresponding input data accurately. In some embodiments, referring to FIG. 1 and FIG. 3, the memory transmission terminal 111 includes: a first transmission terminal A, a second transmission terminal B, a third transmission terminal C, and a fourth transmission terminal D; the bus transmission terminal 112 includes: a fifth transmission terminal E and a sixth transmission terminal F; the interactive transmission terminal 113 includes: a seventh transmission terminal G and an eighth transmission terminal H.

The first transmission terminal A and the second transmission terminal B are connected to a memory region 102 of the memory different from a memory region 102 to which the third transmission terminal C and the fourth transmission terminal D are connected. The first transmission terminal A and the third transmission terminal C are configured to transmit low-bit data; the second transmission terminal B and the fourth transmission terminal D are configured to transmit high-bit data; the fifth transmission terminal E and the sixth transmission terminal F are configured to perform interactive data transmission between the data bus 103 and the data transmission structure 101 to which the fifth transmission terminal E and the sixth transmission terminal F belong; the seventh transmission terminal G and the eighth transmission terminal H are configured to perform interactive data transmission between two data transmission structures 101.

It should be noted that, the first transmission terminal A and the second transmission terminal B may be configured to transmit high-bit data and low-bit data of the same piece of data. For example, for transmission of 16-bit data, the first transmission terminal A is configured to transmit data of lower 8 bits, and the second transmission terminal B is configured to transmit data of higher 8 bits. The first transmission terminal A and the second transmission terminal B may alternatively be configured to transmit different data. For transmission of 8-bit data, the first transmission terminal A and the second transmission terminal B may be configured to transmit different data.

Further, in some embodiments, the fifth transmission terminal E is configured to perform interactive data transmission between the data bus 103 and the data transmission structure 101 to which the fifth transmission terminal E belongs; the sixth transmission terminal F is configured to perform one-way data transmission from the data transmission structure 101, to which the sixth transmission terminal F belongs, to the data bus 103. Through special configuration for the fifth transmission terminal E and the sixth transmission terminal F, during transmission from the data bus 103 to the data transmission structure 101, data can only be inputted through the fifth transmission terminal E. On-die ECC detection for data can be implemented by setting an ECC module on the fifth transmission terminal E, without adding extra circuit layout settings for ECC detection during data transmission using the data transmission circuit.

In some embodiments, referring to FIG. 2 in combination with FIG. 3, the input control signal includes: Sel A, Sel B, Sel C, Sel D, Sel E, Sel F, Sel G, and Sel H; the output control signal includes: Dry A, Dry B, Dry C, Dry D, Dry E, Dry F, Dry G, and Dry H.

The first transmission terminal A corresponds to the input control signal Sel A and the output control signal Dry A; the second transmission terminal B corresponds to the input control signal Sel B and the output control signal Dry B; the third transmission terminal C corresponds to the input control signal Sel C and the output control signal Dry C; the fourth transmission terminal D corresponds to the input control signal Sel D and the output control signal Dry D; the fifth transmission terminal E corresponds to the input control signal Sel E and the output control signal Dry E; the sixth transmission terminal F corresponds to the input control signal Sel F and the output control signal Dry F; the seventh transmission terminal G corresponds to the input control signal Sel G and the output control signal Dry G; the eighth transmission terminal H corresponds to the input control signal Sel H and the output control signal Dry H.

Referring to FIG. 1 and FIG. 3, data inputted from the memory transmission terminal 111 is outputted through the bus transmission terminal 112 or the interactive transmission terminal 113. That is, data read from the first transmission terminal A, the second transmission terminal B, the third transmission terminal C and the fourth transmission terminal D may be read through the fifth transmission terminal E and the sixth transmission terminal F or read through the seventh transmission terminal G and the eighth transmission terminal H.

Data inputted from the bus transmission terminal 112 is outputted through the memory transmission terminal 111 or the interactive transmission terminal 113. That is, data written from the fifth transmission terminal E can be written through the first transmission terminal A, the second transmission terminal B, the third transmission terminal C, and the fourth transmission terminal D or through the seventh transmission terminal G and the eighth transmission terminal H.

Data inputted from the interactive transmission terminal 113 can be outputted through the bus transmission terminal 112 or the memory transmission terminal 111. That is, data inputted from the seventh transmission terminal G and the eighth transmission terminal H can be written through the first transmission terminal A, the second transmission terminal B, the third transmission terminal C, and the fourth transmission terminal D or read through the fifth transmission terminal E and the sixth transmission terminal F.

Referring to FIG. 4 and FIG. 5, the data transmission structure 101 includes: an input unit 201, an output unit 203, and a latch unit 204. The input unit 201 is configured to receive at least one input data and the input control signal, and output the input data corresponding to the input control signal based on the input control signal.

The output unit 203 is configured to receive the input data outputted by the input unit 201 and at least one output control signal and output the input data based on a valid port represented by the output control signal.

The latch unit 204 is connected to the output unit 203 and configured to latch the input data outputted by the output unit 203.

The input unit 201 includes a plurality of input controllers 211. Each input controller 211 corresponds to the memory transmission terminal 111, the bus transmission terminal 112 or the interactive transmission terminal 113. Each input controller 211 is configured to receive the input data and the input control signal from the corresponding memory transmission terminal 111, bus transmission terminal 112, or interactive transmission terminal 113. The input controller 211 is configured to turn on a corresponding port based on the input control signal, to output the input data of the corresponding port.

For example, in the case of data reading, referring to FIG. 4, data of the memory region connected to the data transmission structure 101 is read out through the first transmission terminal A, the second transmission terminal B, the third transmission terminal C or the fourth transmission terminal D; alternatively, data of the memory region connected to another data transmission structure 101 may be read out through the seventh transmission terminal G and the eighth transmission terminal H.

Input data Data A of the first transmission terminal A is connected to an input controller 211, where the input controller is controlled through the input control signal Sel A, and upon reception of the input control signal Sel A, the input data Data A of the first transmission terminal A is outputted. Input data Data B of the second transmission terminal B is connected to an input controller 211, where the input controller is controlled through the input control signal Sel B, and upon reception of the input control signal Sel B, the input data Data B of the second transmission terminal B is outputted. Input data Data C of the third transmission terminal C is connected to an input controller 211, where the input controller is controlled through the input control signal Sel C, and upon reception of the input control signal Sel C, the input data Data C of the third transmission terminal C is outputted. Input data Data D of the fourth transmission terminal D is connected to an input controller 211, where the input controller is controlled through the input control signal Sel D, and upon reception of the input control signal Sel D, the input data Data D of the fourth transmission terminal D is outputted. Input data Data G of the seventh transmission terminal G is connected to an input controller 211, where the input controller is controlled through the input control signal Sel G, and upon reception of the input control signal Sel G, the input data Data G of the seventh transmission terminal G is outputted. Input data Data H of the eighth transmission terminal H is connected to an input controller 211, where the input controller is controlled through the input control signal Sel H, and upon reception of the input control signal Sel H, the input data Data H of the eighth transmission terminal H is outputted.

Specifically, in the case of data writing, referring to FIG. 5, data is written into the data transmission structure 101 through the fifth transmission terminal E, or written data received by another data transmission structure 101 is written through the seventh transmission terminal G and the eighth transmission terminal H.

Input data Data E of the fifth transmission terminal E is connected to an input controller 211, where the input controller is controlled through the input control signal Sel E, and upon reception of the input control signal Sel E, the input data Data E of the fifth transmission terminal E is outputted. Input data Data G of the seventh transmission terminal G is connected to an input controller 211, where the input controller is controlled through the input control signal Sel G, and upon reception of the input control signal Sel G, the input data Data G of the seventh transmission terminal G is outputted. Input data Data H of the eighth transmission terminal H is connected to an input controller 211, where the input controller is controlled through the input control signal Sel H, and upon reception of the input control signal Sel H, the input data Data H of the eighth transmission terminal H is outputted.

In some embodiments, the data transmission structure further includes a mask unit 202 configured to generate mask data DM according to the input data Data E of the fifth transmission terminal E. The mask data DM is inputted through the input controller 211 corresponding to the fifth transmission terminal E, to implement selective input for data on the data bus 103.

Specifically, the memory includes a data mask (DM) function and a data bus inversion (DBI) function. When the data mask is effective, corresponding 8-bit data is not written; when more than half of bits in the written 8-bit data are 1, the written 8-bit data is inverted if the transmission path 0 consumes less power. When both the DM function and the DBI function are enabled, because the data mask signal and the data inversion signal need to use the same data port, only one of the signals can be inputted. In the present disclosure, the data inversion signal is inputted. In other words, during data writing, the input data and the data inversion signal are transmitted to the data transmission structure together. When the data inversion signal is valid, it indicates that the synchronously inputted input data Data E needs to be inverted. Inversion is unnecessary if the input data Data E does not need to be written. Therefore, the data inversion signal being valid also indicates that the input data Data E needs to be written. When the data inversion signal is invalid, if the input data is inputted normally more than half of bits of the input data should be 0. In other words, when the data inversion signal is invalid, it is necessary to detect whether half of bits or more of the input data are 0; if yes, the data is inputted normally without data inversion; if less than half of bits of the input data are 0 and more than half of bits are 1, the input data in this case represents that the data mask signal is valid, and the corresponding 8-bit input data is shielded and not stored into the memory array.

In other words, when the data inversion signal is valid, the fifth transmission terminal E receives the 8-bit original data to be written, and the inverter unit 207 receives the inversion control signal DBI. The inversion control signal DBI in this case represents that a data flipping signal is valid. For example, the inversion control signal DBI is 1, and data inputted from the input unit 201 is flipped to be outputted to the output unit 203. When the data inversion signal is invalid, whether the fifth transmission terminal E receives the 8-bit original data to be written or the mask data DM is determined according to the content of Data E. Specifically, when the data inversion signal is invalid, inputted/outputted Data E is encoded/decoded through the mask unit 202, to determine whether the data mask signal is valid (the signal is valid if it is 1, and invalid if it is 0). If the data mask DM is indicates that the data mask signal is valid, the 8-bit original data does not need to be written. In this case, the fifth transmission terminal E receives the mask data DM; if the data mask DM indicates that the data mask signal is invalid, the 8-bit original data needs to be written. In this case, the fifth transmission terminal E receives the input data Data E.

It should be noted that, any one of the data transmission structures only inverts data inputted through the corresponding fifth transmission terminal E. That is, during data writing, the inversion control signal DBI received by the flip control sub-unit 221 can only be the inversion control signal corresponding to the input data Data E, rather than the inversion control signal corresponding to the input data Data G and Data H. Because Data G and Data H are data inputted through the seventh input terminal Sel G and the eighth input terminal Sel H, that is, data inputted from the data bus 103 through another data transmission structure. In this case, the data inversion process of the input data has been finished in the inverter unit 207 of another data transmission structure.

The output unit 203 includes: a plurality of output controllers 212. Each output controller 212 corresponds to the memory transmission terminal 111, the bus transmission terminal 112 or the interactive transmission terminal 113. Each output controller 212 is configured to receive the input data and the output control signal from the corresponding memory transmission terminal 111, bus transmission terminal 112 or interactive transmission terminal 113. The output controller 212 is configured to be turned on based on the output control signal, to output the input data.

Specifically, in the case of data reading, referring to FIG. 4, data is read to the data bus 103 through the fifth transmission terminal E or the sixth transmission terminal F; alternatively, data may be read to another data transmission structure 101 through the seventh transmission terminal G and the eighth transmission terminal H, and finally read to another data bus 103 through the fifth transmission terminal E or sixth transmission terminal F corresponding to the other data transmission structure 101.

The output controller 212 connected to the fifth transmission terminal E is controlled through the output control signal Dry E, and upon reception of the output control signal Dry E, data is outputted through the fifth transmission terminal E. The output controller 212 connected to the seventh transmission terminal G is controlled through the output control signal Dry G, and upon reception of the output control signal Dry G, data is outputted through the seventh transmission terminal G; the output controller 212 connected to the eighth transmission terminal H is controlled through the output control signal Dry H, and upon reception of the output control signal Dry H, data is outputted through the eighth transmission terminal H.

Specifically, in the case of data writing, referring to FIG. 5, data is written, through the first transmission terminal A, the second transmission terminal B, the third transmission terminal C or the fourth transmission terminal D, into the memory region connected to the data transmission structure 101, or written, through the seventh transmission terminal G and the eighth transmission terminal H, into the memory region connected to another data transmission structure 101.

The output controller 212 connected to the first transmission terminal A is controlled through the output control signal Dry A, and upon reception of the output control signal Dry A, data is outputted through the first transmission terminal A. The output controller 212 connected to the second transmission terminal B is controlled through the output control signal Dry B, and upon reception of the output control signal Dry B, data is outputted through the second transmission terminal B. The output controller 212 connected to the third transmission terminal C is controlled through the output control signal Dry C, and upon reception of the output control signal Dry C, the third transmission terminal C is outputted. The output controller 212 connected to the fourth transmission terminal D is controlled through the output control signal Dry D, and upon reception of the output control signal Dry D, data is outputted through the fourth transmission terminal D. The output controller 212 connected to the seventh transmission terminal G is controlled through the output control signal Dry G, and upon reception of the output control signal Dry G, data is outputted through the seventh transmission terminal G. The output controller 212 connected to the eighth transmission terminal H is controlled through the output control signal Dry H, and upon reception of the output control signal Dry H, data is outputted through the eighth transmission terminal H.

In this embodiment, the latch unit 204 includes a first inverter 214 and a second inverter 213 connected end to end. An input terminal of the first inverter 214 and an output terminal of the second inverter 213 are connected in parallel with an output terminal of the output unit 203. Through parallel connection between the latch unit 204 and the output terminal of the output unit 203, data outputted by the output unit 203 is stored. It should be noted that, in other embodiments, the latch unit includes a first inverter and a second inverter connected end to end. An input terminal of the first inverter and an output terminal of the second inverter are connected series with an output port of the input unit.

Through serial connection between the latch unit and the output terminal of the output unit, so that data outputted by the output unit is latched in an inverted manner, and the data outputted by the output unit is stored subsequently through an inverter connected in series.

In some embodiments, data input is further delayed, to further ensure the accuracy of data in the multi-path transmission process.

Specifically, referring to FIG. 4 and FIG. 5, the data transmission structure further includes: an input selection unit 205 and a trigger unit 206.

The input selection unit 205 is configured to receive at least one input control signal, and generate a strobe corresponding to the input control signal, where the strobe corresponds to a valid port represented by the input control signal, and a selection delay exists between the strobe and the input control signal; and a trigger unit 206 having a clock terminal connected to the input selection unit 205, an input terminal connected to the input unit 201, and an output terminal connected to the output unit 203, and configured to transmit, based on the strobe, the input data received by the input terminal to the output terminal.

The input selection unit 205 includes: a trigger sub-unit 215 configured to receive at least one input control signal, and generate an indication signal if the input control signal is received; and a delay sub-unit 216, connected to the trigger sub-unit 215 and configured to delay the indication signal; and a conversion sub-unit 217, connected to the delay sub-unit 216 and configured to convert the delayed indication signal into the strobe. The delay sub-unit 216 delays the indication signal, to ensure that the data transmission structure outputs the input data correspondingly. Specific delay parameters of the delay sub-unit 216 are set based on the memory to which the delay sub-unit 216 belongs. In some embodiments, the specific delay parameters of the delay sub-unit 216 can be configured by operators.

The trigger sub-unit 215 in this embodiment is implemented by an OR gate. During data reading, referring to FIG. 4, the input control signal Sel A, Sel B, Sel C, Sel D, Sel G or Sel H is inputted to the trigger sub-unit 215. The trigger sub-unit 215 generates an indication signal based on an active level of the input control signal Sel A, Sel B, Sel C, Sel D, Sel G or Sel H. After being delayed by the delay sub-unit 216, the indication signal is converted into the strobe by the conversion sub-unit 217, to drive the trigger unit 206. During data writing, referring to FIG. 5, the input control signal Sel E, Sel G or Sel H is inputted to the trigger sub-unit 215. The trigger sub-unit 215 generates an indication signal based on an active level of the input control signal Sel E, Sel G or Sel H. After being delayed by the delay sub-unit 216, the indication signal is converted into the strobe by the conversion sub-unit 217, to drive the trigger unit 206.

In some embodiments, the trigger unit consists of a D flip-flop.

In some embodiments, the data transmission structure 101 further includes: an inverter unit 207, disposed between the trigger unit 206 and the input unit 201 and configured to output the input data or invert and output the input data based on an inversion control signal.

An inversion control signal after data is quantized. The inverter unit directly outputs the data or inverts and outputs the data, to reduce the data energy consumption of the data transmission structure 101. Specifically, since low-level data transmission consumes less energy, low-level data transmission can save energy. If high-level data is more than low-level data after data quantization, the inversion control signal controls the data to be inverted before being transmitted; if high-level data is less than low-level data in the data, the inversion control signal controls the data to be transmitted directly.

Referring to FIG. 4 and FIG. 5, the inverter unit 207 includes: a flip control sub-unit 221 configured to receive the inversion control signal, and generate a first control signal and a second control signal based on the inversion control signal; a first selection sub-unit 222 and a second selection sub-unit 223, which are connected in parallel and have an input terminal configured to receive the input data and an output terminal connected to the trigger unit 206. The first selection sub-unit 222 is configured to be turned on based on the first control signal, to invert and output the input data; the second selection sub-unit 223 is configured to be turned on based on the second control signal, to output the input data directly.

It should be noted that, the first control signal and the second control signal may be used as two signals to drive the first selection sub-unit 222 and the second selection sub-unit 223, or may be used as a high level and a low level of the same signal to drive the first selection sub-unit 222 and the second selection sub-unit 223.

Referring to FIG. 4, in some embodiments, the inverter unit 207 further includes: a judging sub-unit 224 configured to receive input data and generate the inversion control signal based on the input data.

In this embodiment, the control module 104 controls data transmission paths of two data transmission structures 101, so that different data transmission structures transmit data alternately. Data transmission of different memory regions 102 can be implemented corresponding to the same data transmission structure 101. Through alternate transmission of multiple paths of data, data transmission is more compact, thereby improving the data transmission efficiency of the memory.

It should be noted that, determining whether the signal exists or not is an example of the signal driving method mentioned in this embodiment. In an actual application, driving may be performed depending on whether the signal exists or not or depending on a high level or low level of the signal, that is, in the presence of the signal, driving is performed depending on whether the level of the signal is an active level.

Each unit involved in this embodiment is a logical unit. During actual application, a logical unit may be a physical unit, or may be a part of a physical unit, or may be implemented as a combination of a plurality of physical units. In addition, in order to highlight the innovative part of the present disclosure, units that are not closely related to resolving the technical problem proposed by the present disclosure are not introduced in this embodiment, but this does not indicate that there are no other units in this embodiment.

It is to be noted that features disclosed in the data transmission circuit in the above embodiment may be combined freely without conflicts to obtain a new embodiment of the data transmission circuit.

Another embodiment of the present disclosure provides a data transmission method, which is applicable to the data transmission circuit provided in the foregoing embodiment, to improve the transmission efficiency of read/written data of the memory.

Figure 6:
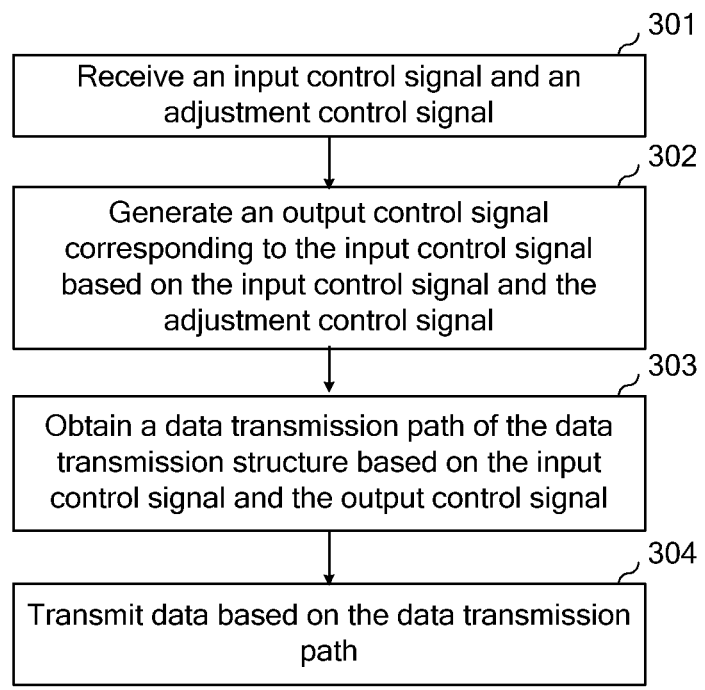
FIG. 6 is a schematic flowchart of a data transmission method according to another embodiment of the present disclosure.

FIG. 6 is a schematic flowchart of a data transmission method according to this embodiment. The data transmission method provided by this embodiment is further described in detail below with reference to the accompanying drawings.

Referring to FIG. 6, the data transmission method includes the following steps:

Step 301: Receive an input control signal and an adjustment control signal.

Step 302: Generate an output control signal corresponding to the input control signal based on the input control signal and the adjustment control signal.

A signal delay controlled by the adjustment control signal exists between the input control signal and the output control signal.

Step 303: Obtain a data transmission path based on the input control signal and the output control signal.

Step 304: Transmit data based on the data transmission path.

Specifically, in the case of data reading, referring to FIG. 4, data of the memory region connected to the data transmission structure 101 is read out through the first transmission terminal A, the second transmission terminal B, the third transmission terminal C or the fourth transmission terminal D; alternatively, data of the memory region connected to another data transmission structure 101 may be read out through the seventh transmission terminal G and the eighth transmission terminal H.

Input data Data A of the first transmission terminal A is connected to an input controller 211, where the input controller is controlled through the input control signal Sel A, and upon reception of the input control signal Sel A, the input data Data A of the first transmission terminal A is outputted. Input data Data B of the second transmission terminal B is connected to an input controller 211, where the input controller is controlled through the input control signal Sel B, and upon reception of the input control signal Sel B, the input data Data B of the second transmission terminal B is outputted. Input data Data C of the third transmission terminal C is connected to an input controller 211, where the input controller is controlled through the input control signal Sel C, and upon reception of the input control signal Sel C, the input data Data C of the third transmission terminal C is outputted. Input data Data D of the fourth transmission terminal D is connected to an input controller 211, where the input controller is controlled through the input control signal Sel D, and upon reception of the input control signal Sel D, the input data Data D of the fourth transmission terminal D is outputted. Input data Data G of the seventh transmission terminal G is connected to an input controller 211, where the input controller is controlled through the input control signal Sel G, and upon reception of the input control signal Sel G, the input data Data G of the seventh transmission terminal G is outputted. Input data Data H of the eighth transmission terminal H is connected to an input controller 211, where the input controller is controlled through the input control signal Sel H, and upon reception of the input control signal Sel H, the input data Data H of the eighth transmission terminal H is outputted.

Data is read to the data bus 103 through the fifth transmission terminal E or the sixth transmission terminal F, or read to another data transmission structure 101 through the seventh transmission terminal G and the eighth transmission terminal H.

The output controller 212 connected to the fifth transmission terminal E is controlled through the output control signal Dry E, and upon reception of the output control signal Dry E, data is outputted through the fifth transmission terminal E. The output controller 212 connected to the seventh transmission terminal G is controlled through the output control signal Dry G, and upon reception of the output control signal Dry G, data is outputted through the seventh transmission terminal G; the output controller 212 connected to the eighth transmission terminal H is controlled through the output control signal Dry H, and upon reception of the output control signal Dry H, data is outputted through the eighth transmission terminal H.

Specifically, in the case of data writing, referring to FIG. 5, data is written into the data transmission structure 101 through the fifth transmission terminal E, or written data received by another data transmission structure 101 is written through the seventh transmission terminal G and the eighth transmission terminal H.

Input data Data E of the fifth transmission terminal E is connected to an input controller 211, where the input controller is controlled through the input control signal Sel E, and upon reception of the input control signal Sel E, the input data Data E of the fifth transmission terminal E is outputted. Input data Data G of the seventh transmission terminal G is connected to an input controller 211, where the input controller is controlled through the input control signal Sel G, and upon reception of the input control signal Sel G, the input data Data G of the seventh transmission terminal G is outputted. Input data Data H of the eighth transmission terminal H is connected to an input controller 211, where the input controller is controlled through the input control signal Sel H, and upon reception of the input control signal Sel H, the input data Data H of the eighth transmission terminal H is outputted.

In some embodiments, a mask unit 202 is configured to generate mask data DM E according to the input data Data E of the fifth transmission terminal E. The mask data DM E is inputted through the input controller 211 corresponding to the fifth transmission terminal E, to implement selective input for data on the data bus 103.

Data is written, through the first transmission terminal A, the second transmission terminal B, the third transmission terminal C or the fourth transmission terminal D, into the memory region connected to the data transmission structure 101, or written, through the seventh transmission terminal G and the eighth transmission terminal H, into the memory region connected to another data transmission structure 101.

The output controller 212 connected to the first transmission terminal A is controlled through the output control signal Dry A, and upon reception of the output control signal Dry A, data is outputted through the first transmission terminal A. The output controller 212 connected to the second transmission terminal B is controlled through the output control signal Dry B, and upon reception of the output control signal Dry B, data is outputted through the second transmission terminal B. The output controller 212 connected to the third transmission terminal C is controlled through the output control signal Dry C, and upon reception of the output control signal Dry C, the third transmission terminal C is outputted. The output controller 212 connected to the fourth transmission terminal D is controlled through the output control signal Dry D, and upon reception of the output control signal Dry D, data is outputted through the fourth transmission terminal D. The output controller 212 connected to the seventh transmission terminal G is controlled through the output control signal Dry G, and upon reception of the output control signal Dry G, data is outputted through the seventh transmission terminal G. The output controller 212 connected to the eighth transmission terminal H is controlled through the output control signal Dry H, and upon reception of the output control signal Dry H, data is outputted through the eighth transmission terminal H.

In this embodiment, the control module controls data transmission paths of two data transmission structures, so that different data transmission structures transmit data alternately. Data transmission of different memory regions can be implemented corresponding to the same data transmission structure. Through alternate transmission of multiple paths of data, data transmission is more compact, thereby improving the data transmission efficiency of the memory.

Another embodiment of the present disclosure provides a memory, which adopts the data transmission circuit provided by the foregoing embodiment to transmit data, so as to improve transmission efficiency of read/written data of the memory.

In some embodiments, the memory is a DRAM chip provided with memory meeting a DDR2 memory specification.

In some embodiments, the memory is a DRAM chip provided with memory meeting a DDR3 memory specification.

In some embodiments, the memory is a DRAM chip provided with memory meeting a DDR4 memory specification.

In some embodiments, the memory is a DRAM chip provided with memory meeting a DDR5 memory specification.

Persons skilled in the art should understand that the embodiments of the present disclosure may be provided as a method, an apparatus (device), or a computer program product. Therefore, the present disclosure may use a form of hardware only embodiments, software only embodiments, or embodiments with a combination of software and hardware. Moreover, the present disclosure may be in a form of a computer program product that is implemented on one or more computer-usable storage media that include computer-usable program code. The computer storage media include volatile, non-volatile, removable, and non-removable media implemented in any method or technology for storing information (such as computer-readable instructions, data structures, program modules, or other data), including but not limited to, a random access memory (RAM), a read-only memory (ROM), an electrically erasable programmable read-only memory (EEPROM), a flash memory or other storage technologies, a compact disc read-only memory (CD-ROM), a digital versatile disk (DVD) or other optical disc storage, a magnetic cassette, a magnetic tape, magnetic disk storage or other magnetic storage apparatuses, or any other medium that can be used to store desired information and can be accessed by a computer. In addition, as is well known to persons of ordinary skill in the art, the communication media usually contain computer-readable instructions, data structures, program modules, or other data in modulated data signals such as carrier waves or other transmission mechanisms, and may include any information transfer medium.

The present disclosure is described with reference to the flowcharts and/or block diagrams of the method, the apparatus (device), and the computer program product according to the embodiments of the present disclosure. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, such that the instructions executed by a computer or a processor of any other programmable data processing device generate an apparatus for implementing a specific function in one or more processes in the flowcharts and/or in one or more blocks in the block diagrams.

These computer program instructions may be stored in a computer readable memory that can instruct the computer or any other programmable data processing device to work in a specific manner, such that the instructions stored in the computer readable memory generate an artifact that includes an instruction apparatus. The instruction apparatus implements a specific function in one or more processes in the flowcharts and/or in one or more blocks in the block diagrams.

These computer program instructions may also be loaded onto a computer or another programmable data processing device, such that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

In the specification, the terms "include", "comprise", or any other variations thereof are intended to cover a non-exclusive inclusion, such that an article or a device including a series of elements not only includes those elements, but also includes other elements that are not explicitly listed, or also includes inherent elements of the article or the device. Without more restrictions, the elements defined by the statement "including a . . . " do not exclude the existence of other identical elements in the article or device including the elements.

The preferred embodiments of the present disclosure are described above. However, those skilled in the art can make changes and modifications to these embodiments once they learn the basic inventive concept of the present disclosure. Therefore, the appended claims are intended to be interpreted as including the preferred embodiments and all changes and modifications falling within the scope of the present disclosure.

Apparently, those skilled in the art can make various modifications and variations to the present disclosure without departing from the spirit and scope of the present disclosure. In this way, if these changes and modifications to the present disclosure fall within the scope of the claims of the present disclosure and equivalent technologies thereof, the present disclosure is further intended to include these changes and modifications.

INDUSTRIAL APPLICABILITY

The data transmission circuit provided in the present disclosure can improve the transmission efficiency of read/written data of the memory and ensure accuracy of data transmission.

The invention claimed is:

1. A data transmission circuit, applied to a memory that comprises a data bus and a plurality of memory regions, the data transmission circuit comprising at least two data transmission structures, wherein
each of the data transmission structures comprises a memory transmission terminal, a bus transmission terminal, and an interactive transmission terminal, the memory transmission terminal is configured to connect to the memory region, the bus transmission terminal is configured to connect to the data bus, and the interactive transmission terminal is configured to connect to another data transmission structure;

data inputted from the memory transmission terminal is outputted through the bus transmission terminal or the interactive transmission terminal;

data inputted from the bus transmission terminal is outputted through the memory transmission terminal or the interactive transmission terminal;

data inputted from the interactive transmission terminal is outputted through the bus transmission terminal or the memory transmission terminal; the data inputted from the interactive transmission terminal is data inputted through the bus transmission terminal or the memory transmission terminal of another data transmission structure; and a control module is connected to the data transmission structure and receives an input control signal and an adjustment control signal that are provided by the memory; the control module is configured to output the input control signal in a delayed manner based on the adjustment control signal, so as to generate an output control signal corresponding to the input control signal, wherein the input control signal and the output control signal are used for indicating a data transmission path of the data transmission structure.

2. The data transmission circuit according to claim 1, wherein a signal delay between the input control signal and the output control signal is controlled by the adjustment control signal.

3. The data transmission circuit according to claim 1, wherein the data transmission structure comprises:
   an input unit configured to receive at least one input data and the input control signal, and output the input data corresponding to the input control signal based on the input control signal;
   an output unit configured to receive the input data outputted by the input unit and at least one output control signal, and configured to output the input data based on a valid port represented by the output control signal; and
   a latch unit, connected to the output unit and configured to latch the input data outputted by the output unit.

4. The data transmission circuit according to claim 3, wherein the input unit comprises:
   a plurality of input controllers, wherein each of the input controllers corresponds to the memory transmission terminal, the bus transmission terminal, or the interactive transmission terminal;
   each of the input controllers is configured to receive the input data and the input control signal from the corresponding memory transmission terminal, bus transmission terminal or interactive transmission terminal; and
   the input controller is configured to turn on a corresponding port based on the input control signal, to output the input data of the corresponding port.

5. The data transmission circuit according to claim 3, wherein the output unit comprises:
   a plurality of output controllers, wherein each of the output controllers corresponds to the memory transmission terminal, the bus transmission terminal or the interactive transmission terminal;
   each of the output controllers is configured to receive the input data and the output control signal that are outputted by the input unit of the corresponding memory transmission terminal, bus transmission terminal or interactive transmission terminal; and
   the output controller is configured to turn on a corresponding port based on the output control signal, to output the input data through the corresponding port.

6. The data transmission circuit according to claim 3, wherein the latch unit comprises: a first inverter and a second inverter connected end to end, and an input terminal of the first inverter and an output terminal of the second inverter are connected in parallel with an output terminal of the output unit.

7. The data transmission circuit according to claim 3, wherein the data transmission structure further comprises:
   an input selection unit configured to receive at least one input control signal, and generate a strobe corresponding to the input control signal, wherein the strobe corresponds to a valid port represented by the input control signal, and a selection delay exists between the strobe and the input control signal; and
   a trigger unit having a clock terminal connected to the input selection unit, an input terminal connected to the input unit, and an output terminal connected to the output unit, and configured to transmit, based on the strobe, the input data received by the input terminal to the output terminal.

8. The data transmission circuit according to claim 7, wherein the input selection unit comprises:
   a trigger sub-unit configured to receive at least one input control signal, and generate an indication signal if the input control signal is received;
   a delay sub-unit, connected to the trigger sub-unit and configured to delay the indication signal; and
   a conversion sub-unit, connected to the delay sub-unit and configured to convert the delayed indication signal into the strobe.

9. The data transmission circuit according to claim 7, wherein the trigger unit consists of a D flip-flop.

10. The data transmission circuit according to claim 7, wherein the data transmission structure further comprises: an inverter unit, disposed between the trigger unit and the input unit and configured to output the input data or invert and output the input data based on an inversion control signal.

11. The data transmission circuit according to claim 10, wherein the inverter unit comprises:
   a flip control sub-unit configured to receive the inversion control signal, and generate a first control signal and a second control signal based on the inversion control signal; and
   a first selection sub-unit and a second selection sub-unit, which are connected in parallel and have an input terminal configured to receive the input data and an output terminal connected to the trigger unit, wherein the first selection sub-unit is configured to be turned on based on the first control signal, to invert and output the input data; and
   the second selection sub-unit is configured to be turned on based on the second control signal, to output the input data.

12. The data transmission circuit according to claim 1, wherein the memory transmission terminal comprises: a first transmission terminal, a second transmission terminal, a third transmission terminal, and a fourth transmission terminal; the bus transmission terminal comprises: a fifth transmission terminal and a sixth transmission terminal; the interactive transmission terminal comprises: a seventh transmission terminal and an eighth transmission terminal; and the first transmission terminal and the second transmission terminal are connected to a memory region of the memory different from a memory region to which the third transmission terminal and the fourth transmission terminal are connected; the first transmission terminal and the third transmission terminal are configured to transmit low-bit data; the second transmission terminal and the fourth transmission terminal are configured to transmit high-bit data; the fifth transmission terminal and the sixth transmission terminal are configured to perform interactive data transmission between the data bus and the data transmission structure to which the fifth transmission terminal and the sixth transmission terminal belong; and the seventh transmission terminal and the eighth transmission terminal are configured to perform interactive data transmission between two data transmission structures.

13. The data transmission circuit according to claim 12, wherein
the fifth transmission terminal is configured to perform interactive data transmission between the data bus and the data transmission structure to which the fifth transmission terminal belongs; and
the sixth transmission terminal is configured to perform one-way data transmission from the data transmission structure, to which the sixth transmission terminal belongs, to the data bus.

14. A data transmission method, applied to the data transmission circuit according to claim 1, comprising:
receiving the input control signal and the adjustment control signal;
generating the output control signal corresponding to the input control signal based on the input control signal and the adjustment control signal, wherein a signal delay between the input control signal and the output control signal is controlled by the adjustment control signal;
obtaining the data transmission path based on the input control signal and the output control signal; and
transmitting data based on the data transmission path.

15. A memory, adopting the data transmission circuit according to claim 1.

* * * * *